(12) United States Patent
Watson

(10) Patent No.: US 7,074,481 B2
(45) Date of Patent: Jul. 11, 2006

(54) ADHESIVES FOR SEMICONDUCTOR APPLICATIONS EFFICIENT PROCESSES FOR PRODUCING SUCH DEVICES AND THE DEVICES PER SE PRODUCED BY THE EFFICIENT PROCESSES

(75) Inventor: Michael John Watson, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 09/954,262

(22) Filed: Sep. 17, 2001

(65) Prior Publication Data

US 2003/0054162 A1 Mar. 20, 2003

(51) Int. Cl.
*B32B 5/16* (2006.01)

(52) U.S. Cl. ............. 428/323; 428/327; 526/59; 526/72; 196/60

(58) Field of Classification Search ........... 428/323, 428/327; 526/59, 72; 196/60
See application file for complete search history.

(56) References Cited

U.S. PATENT DOCUMENTS

| | | | |
|---|---|---|---|
| 4,491,553 A * | 1/1985 | Yamada et al. ............. 264/51 |
| 4,766,176 A | 8/1988 | Lee et al. |
| 5,017,654 A | 5/1991 | Togashi et al. |
| 5,148,266 A | 9/1992 | Khandros et al. |
| 5,326,845 A * | 7/1994 | Linden ............. 528/28 |
| 5,346,861 A | 9/1994 | Khandros et al. |
| 5,347,159 A | 9/1994 | Khandros et al. |
| 5,477,611 A | 12/1995 | Sweis et al. |
| 5,977,226 A | 11/1999 | Dent et al. |
| 6,352,775 B1 * | 3/2002 | Sasaki et al. ............. 428/403 |
| 6,403,711 B1 * | 6/2002 | Yang et al. ............. 525/100 |
| 6,410,415 B1 * | 6/2002 | Estes et al. ............. 438/612 |
| 6,555,187 B1 | 4/2003 | Kitamura |

FOREIGN PATENT DOCUMENTS

| JP | 7-292343 | 11/1995 |
| JP | H11-193828 | 7/1999 |
| JP | H11-193829 | 7/1999 |

* cited by examiner

*Primary Examiner*—Stevan A. Resan
(74) *Attorney, Agent, or Firm*—Robert L. McKellar; McKellar IP Law, PLLC

(57) ABSTRACT

Die attach adhesives and methods for their use, along with the devices that are obtained by the use of the methods. Using semiconductor chips as an example, the adhesives and the method for using them provides an interface between a chip (die) and the chip support. The method includes creating a space between the chip and the chip support of a given sized opening.

18 Claims, 3 Drawing Sheets

ADHESIVES FOR SEMICONDUCTOR APPLICATIONS EFFICIENT PROCESSES FOR PRODUCING SUCH DEVICES AND THE DEVICES PER SE PRODUCED BY THE EFFICIENT PROCESSES

The invention disclosed herein deals with die attach adhesives and methods for their use, along with the devices that are obtained by the use of the methods.

Using semiconductor chips as an example, the adhesives and the method for using them provides an interface between a chip (die) and the chip support. The method includes creating a space between the chip and the chip support of a given sized opening.

BACKGROUND OF THE INVENTION

In the construction of semiconductor assemblies, it has been found that curable elastomeric materials can be used to create a space between the semiconductor and its support, such construction being disclosed in the U.S. Patents of the prior art discussed infra. The most common is the assembly of one or more semiconductor chips on a substrate such as polyimide film which forms part of a chip carrier package including a circuit panel or chip housing.

A chip carrier includes a dielectric layer with an array of terminals and may also contain leads. The chip carrier is fastened to a semiconductor chip through the leads or wire bonds. An elastomeric material is disposed between the chip and the flexible dielectric layer of the chip carrier. The chip carrier and elastomeric material are also referred to as an "interposer" or "interposer layer", by those skilled in the art. The leads or wire bonds of the chip carrier are bonded to the chip so that the terminals of the carrier are electrically connected to the contacts on the chip. The entire structure can then be mounted to a substrate such as a circuit panel or chip housing. The terminals of the chip carrier are electrically connected to contacts on the substrate. The elastomeric layer provides resiliency to the individual terminals allowing each terminal to move as necessary to accommodate tolerances during testing and in the final assembly itself.

PRIOR ART

The details of the information set forth just above can be found in U.S. Pat. No. 5,477,611 which issued on Dec. 26, 1995 to Sweis, et al, which describes the manufacture of a chip device.

U.S. Pat. No. 5,148,266 that issued on Sep. 15, 1992 to Khandros, et al; U.S. Pat. No. 5,346,861 that issued on Sep. 13, 1994 to Khandros, et al, and U.S. Pat. No. 5,347,159 that issued on Sep. 13, 1994 to Khandros, et al, are based on the same essential disclosure and are also relevant for showing the component parts of chip assemblies and their current manufacturing processes. U.S. Pat. No. 5,477,611 shows the use of liquid resins to create a gap between the chip and the substrate. This material is injected as a liquid and then hardened (cured). The disclosure shows that the material, as it reaches the edges of the chip configuration, creates a meniscus along all outside edges, which is exposed to the atmosphere, which cures prior to the final cure of the interposed layer. This "B-staging" of the edge through the meniscus creates an in-situ mold that contains the liquid between the chip and the substrate until the final cure takes place.

Except for the disclosure of the use of a curable liquid as an interposer material, there is nothing in the above-mentioned patents about creating a gap between the chip and a substrate as provided by the instant invention.

With regard to the prior art dealing with the use of particulate materials as spacers creating the gap between the chip and the substrate, one should be aware of Japanese patent application number H11-193828, filed Jul. 8, 1999 in the name of Isshiki, et al, wherein there is disclosed the use of a die attach adhesive that is based on a curable polymer composition containing a spherical filler with an average particle diameter of from 100 to 1,000 μm and a major axis to minor axis ratio of from 1.0 to 1.5. What is disclosed and emphasized therein is the use of inorganic spherical fillers. However, it is speculated therein that spherical organic fillers can also be used which are selected from the group consisting of carbon, fluororesin, silicone resin, silicone rubber, epoxy resin, polyimide resins, polyphenylene sulfide resins or polyetheretherketone resins, but there are no examples in the application with regard to the use of such spherical organic fillers in that die attach adhesive.

Likewise, Japanese patent application H11-193829, filed Jul. 8, 1999 in the name of Yamaka, et al, deals with die attach adhesives for bonding semiconductor chips to chip mount components wherein the adhesive comprises a curable polymer composition containing a spherical filler with an average particle diameter of from 10 to 100 μm and a major axis to minor axis ratio of 1.0 to 1.5, and they are used in an amount in the range of about 1 to 900 ppm. This disclosure also suggests the use of spherical organic particles in these formulations, but there are no examples of such a use. The suggested organic particles are disclosed as the same list in the above-mentioned Japanese application.

Finally, Japanese Laid-Open Patent Application (Kokai) No. 7-292343 discloses an adhesive agent for a semiconductor device which is comprised of (A) an organopolysiloxane having at least two silicon atom bonded alkenyl groups per molecule, (B) an organopolysiloxane having at least two silicon atom bonded hydrogen atoms per molecule, (C) an organosilicon compound having a silicon atom bonded alkoxy group, (D) an organic or inorganic spherical filler whose particle diameter is 10 to 100 μm and whose major and minor diameter ratio is 1.0 to 1.5, and (E) a catalytic amount of platinum or a platinum compound. No mention is made of any other fillers other than the spherical fillers. Eventhough there are listed numerous organic fillers, there are no examples of the use of such fillers in that formulation.

None of the above-identified references disclose the use of spherical organic fillers in the compositions of the instant invention.

THE INVENTION

Figure 1:
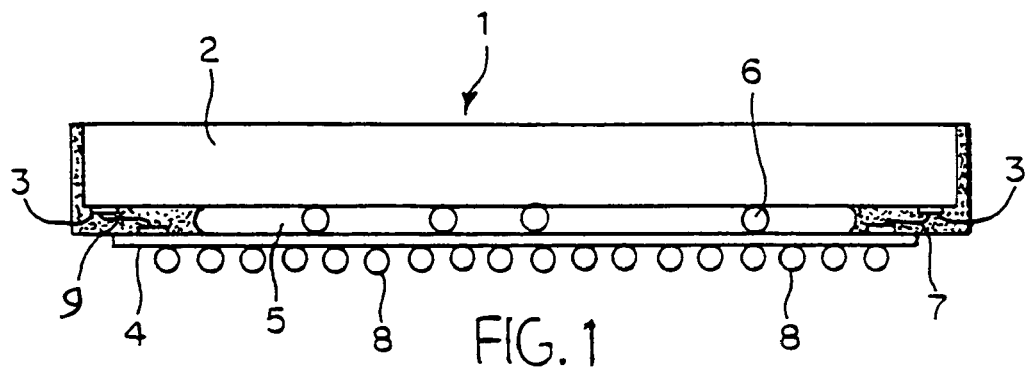
FIG. 1 is a drawing of one device that can be manufactured by the use of the adhesive of this invention and is a full side view thereof.

What is disclosed as the invention herein is an adhesive composition comprising a curable polymer and/or resin and an organic spacer filler in an amount sufficient to allow for good planarity between the semiconductor die and the attachment substrate. Also, there is disclosed a method for using such adhesive to manufacture chip devices, and the disclosure of the chip devices per se. The advantage of the processes disclosed herein is that because of the nature of the die attach adhesive of this invention, there is only required two to three process steps as opposed to five or more process steps when using the methods of manufacture of the prior art.

What is disclosed and claimed herein is a curable adhesive composition comprising in combination a curable polymeric base material and contained in said polymeric base material, insulating particles that are organic insulator particles having average particle sizes of 1 µm to 1000 µm and they have aspect ratios of the major axis to the minor axis of about 1.0 to 1.5. The organic insulator particles are present in the composition in an amount sufficient to provide a planar adhesive bond thickness between substrates being joined by said adhesive composition.

In addition, there is another embodiment of this invention that is a semiconductor device in which at least two individual substrates are joined and bonded by an adhesive composition as described just above.

Still another embodiment of this invention is a process for joining at least two individual substrates, the process comprising applying an adhesive composition as described just above to at least one surface of at least one of the individual substrates and then mounting another individual substrate to the adhesive treated side of the substrate to form a laminate. Then pressure and/or temperature is applied to the laminate to disperse the adhesive between the layers until each of the substrates contact the largest organic insulator particles of the adhesive composition, and thereafter, the adhesive composition is cured. It is contemplated within the scope of this invention to apply pressure and heat at the same time and eventhough the application of pressure, and of heat, can take the form of two or more steps in the process, the preferred mode is to apply the pressure and the heat simultaneously.

Yet another aspect of this invention is a combination of a curable adhesive composition comprising a curable polymeric base material and contained in said polymeric base material, insulating particles that are organic insulator particle having an average particle size of 1 µm to 1000 µm and they have aspect ratios of the major axis to the minor axis of about 1.0 to 1.5. The organic insulator particles are present in the composition in an amount sufficient to provide a planar adhesive bond thickness between substrates being joined by said adhesive composition. In addition, there is present, inorganic insulator particles having a particle size of less than 10 µm in an amount sufficient to obtain an adhesive with a linear thermal expansion coefficient before and after the glass transition temperature of less than 240 µm/m/° C. between −55° C. and +200° C.

Turning now to the curable base adhesive composition, it is contemplated within the scope of this invention to provide any curable polymeric adhesive composition as the base material as long as the adhesive is capable of bonding the chip to any desired substrate. Such curable polymeric compositions are known in the art and can be any of a curable silicone composition; a curable epoxy composition; a curable polyimide composition, or, a curable acrylic composition. Preferred for this invention are curable epoxy and silicone compositions, and most preferred are curable silicone compositions.

Especially preferred are the compositions set forth and described in U.S. Pat. No. 5,977,226, that issued on Nov. 2, 1999 to Dent et al, and U.S. Pat. No. 4,766,176, that issued on Aug. 23, 1988 to Lee, et al, and U.S. Pat. No. 5,017,654, that issued May 21, 1991 to Atsushi, et al, the compositions of which, and the teachings for the preparation of such compositions, are incorporated herein by reference.

Also included as a specially preferred embodiment of this invention are compositions that are essentially those set forth in Dent et al, but which contain an additional filler which is a filler which will provide a lowered coefficient of thermal expansion to the formulation in addition to organic spacer particles to control adhesive bond thickness. Such low Coefficient of Thermal Expansion (CTE) fillers, for purposes of this invention can be any filler which is compatible with the formulated product and which will in addition provide a reduced coefficient of thermal expansion. Such CTE fillers are for example selected from metal oxides, such as boron nitride, aluminum oxide, aluminum nitride, and the like, and these materials coated with polymeric materials or coupling agents, metal nitride, glass and other such inorganic electrical insulator particles. It is preferred that the particles have a size of less than 10 µm and are present in an amount sufficient to obtain an adhesive with a linear thermal expansion coefficient before and after the glass transition temperature, of less than 240 µm/m/° C. between −55° C. and +200° C.

The benefit of such additional fillers will become evident to those skilled in the art in conjunction with the information provided in the examples set forth infra in this disclosure.

It should be noted by those skilled in the art that the mode of cure of the adhesive compositions of this invention is not critical, and can include cure mechanisms such as condensation reactions; addition reactions; ultraviolet radiation initiated reactions, and, free radical initiated reactions.

Preferred for the adhesive compositions of this invention are those that are cured by addition reactions and ultraviolet radiation initiated reactions, and especially preferred are those based on addition reactions, and most preferred are those based on addition reactions of the silicone compositions, wherein hydrogen bonded to silicon atoms of one molecule are added to unsaturated groups bonded on the silicon atoms of another molecule wherein the reactions are catalyzed by platinum catalysts. The platinum catalysts are preferably those set forth and disclosed in U.S. Pat. No. 4,766,176 set forth Supra.

DETAILED DESCRIPTION OF THE FIGURES

Turning now to the devices of this invention, reference should be made to FIG. 1, in which there is shown one device that can be manufactured by the processes of this invention.

There is shown the package 1, in which a semiconductor die 2 is bonded to a polyimide TAB tape flexible circuit 4, also showing the die attach adhesive 5, containing spacer beads 6 to maintain a specified distance between the die 2 and the TAB tape 4 during die placement. Also shown are electrical contacts 3. There is also shown lead bonds 7 which are dependent upon the height of the die 2 from the TAB tape 4. The Figure also shows the encapsulant 9 used to protect the lead bonds 7, and also shown are the solder balls 8 which are located beneath the polyimide film 4. The solder balls 8 provide the connection mechanism to the board (not shown) upon which the package 1 will be mounted for use.

Figure 2:
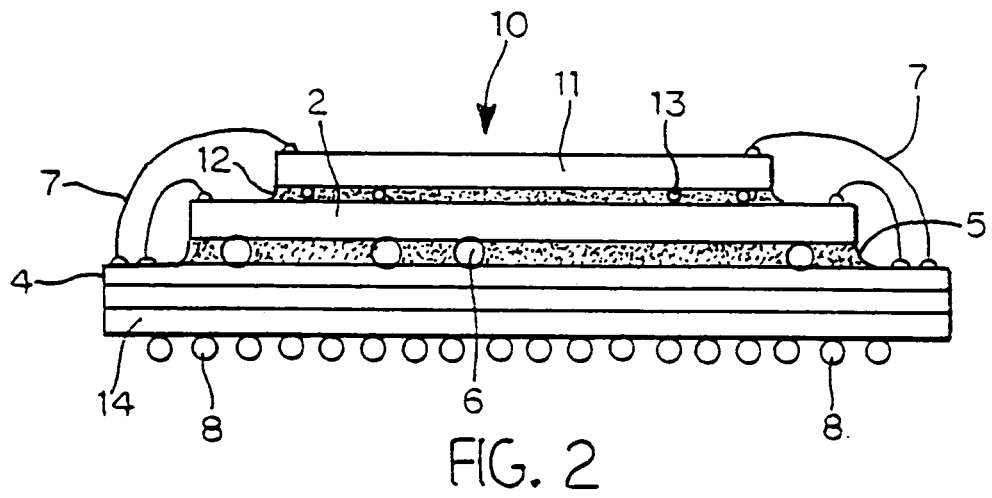
FIG. 2 is a yet another device of this invention that can be manufactured by the use of the adhesive of this invention in which there is shown a full side view of a semiconductor die that has been stacked on the top of another semiconductor die in a package.

In FIG. 2, there is shown yet another device of this invention that can be manufactured by the use of the adhesive of this invention in which there is shown a fill side view of another device package 10 in which one semiconductor die 11 has been stacked on the top of the semiconductor die 2 to form said package 10.

Thus, there is shown the circuit substrate (polyimide, epoxy-fiberglass, or other substrate material) 4 which can be flexible or rigid, the die attach adhesive 5, containing the spacer beads 6 between the die 2 and the substrate 4, along with lead bonds 7, the solder balls 8, and another layer of die attach adhesive 12. The die attach adhesive 12 contains spacer beads 13, which spacer beads 13 are smaller in size than the spacer beads 6 of the die attach adhesive 5. It should be noted by those skilled in the art that the size of the spacer particles can be different between the different levels, or can be essentially the same, depending on the need of the manufacturer.

Assembly of such a device 10 is done by applying the adhesive 5 that contains, the spacer beads 6, to the circuit board 14, that has been previously surmounted by the substrate circuit 4. Then, the hot die 2 is placed on the adhesive with enough force to spread the adhesive uniformly under the die 2. The force required can actually be by the pressure of the hand. High pressures are not needed as can be observed by reviewing the viscosity of the die attach adhesive of the examples.

The heat partially cures the die attach adhesive 5 and the spacer beads 6 provide a mechanism to control the height of the die 2 from the surface of the substrate 4. Another die 11 can then be added on top of the previously mounted die 2 by applying adhesive 12 on top of the first die 2. For purposes of illustration, in FIG. 2, the Adhesive 12 has an alternate sized spacer bead 13 in it. The top die 11 is placed hot on the adhesive 12, allowing it to partially cure to hold the parts in place for subsequent wires 7 to be furnished in the bonding operations leading from the die 2 to the substrate 4. Full cure of the die attach adhesives 5 and 12 is completed when an overmolding is done on top of the package 10. Once an overmolding is applied and cured, solder balls 8 are added to complete the packaging of the package 10.

In the following examples, the die attach adhesive compositions of this invention are illustrated in more detail in which, unless otherwise specified, all parts and percentages are by weight. The examples are presented to further illustrate the invention and are not to be considered as limiting the invention in any way.

Viscosity measurements were made using a 2 cm plate at 25° C. and 1500 dyne constant force on a CP-20 Compression Rheometer from TA Instruments, Inc. located in Newcastle, Del.

Cure exotherm peak temperatures were measured using a Seiko Differential Scanning Calorimeter Model 220C by heating 20 to 25 mg. of material from 25° C. to 200° C. at 10° C./min. in an aluminum sample pan with 25 to 30 cc/min helium gas (High Purity compressed helium, UN1046 from Airgas, Inc., Radnor, Pa.), purge, and an empty aluminum sample pan as a reference. (Seiko Instruments, Torrance, Calif.)

The suppliers supplied all particle sizes and surface areas of the fillers used herein.

The organic spacer particles used herein were separated using Tyler Gold Series full height 8-inch diameter wire mesh sieves with openings as specified.

Modulus at break, elongation at break, and tensile strength at break were determined in the following manner: tensile bars were cut from molded slabs and were tested at a pull speed of 20 in./min. on a Monsanto Tensometer 2000 with a 1 kN load cell. This procedure is described in detail in ASTM D412 using the 0.25 inch width die to cut the tensile bars.

The volume resistivity was measured at room temperature using a guarded electrode method described in ASTM D257-99.

Specific Gravity measurements were taken using a wet/dry balance technique outline per ASTM D792. Test samples were molded, cured, and cut into slabs of approximately one inch by one inch.

Durometer testing was performed per ASTM D2240 using a Shore A Durometer and a 71200 Conveloader, both from the Shore Instrument Manufacturing Company. Samples for test were molded, cured, and cut into slabs of approximately one inch by one inch and then stacked to greater than 0.25 inches prior to measuring the durometer. Dielectric Constant and Dissipation Factors were measured at the specified frequency using a model 1615-A (Schering type) capacitance bridge, Type 722D condenser, Model 1316 oscillator, Type 1690 solid sample holder, and Type 1401 NIST Air Capacitance standard, all purchased from General Radio Co., Poway, Calif. These measurements were made per ASTM D150 using cured molded slabs.

Dielectric Strength of the samples was measured per ASTM D149 using a 110 kV Hypot machine Model No. 4862M2 purchased from Associated Research, Inc, Lake Forest, Ill. Cured molded slabs were used for this testing.

Linear coefficient of thermal expansion (CTE) results were gathered with a TA Instruments Model 2940 TMA (Thermomechanical Analyzer) using a 100 cc/min nitrogen purge at a 5° C./min. heating rate from 25° C. to 200° C. The test sample was molded, cured, and then cut using a 0.25 inch diameter die.

Modulus, elongation, tensile strength, volume resistivity, specific gravity, durometer, dielectric constant, dissipation factor, dielectric strength, and CTE test samples were all taken from molded slabs of 10 inch wide by 10 inch long by 0.090 inches thick, that were cured for 1 hour at 150° C. in a Dake Press at 10 tons pressure using aluminum chase molds. Samples were cut from these molded slabs as indicated or per ASTM standards relating to each test.

Placement of adhesive for die placement performance testing was performed by dispensing, printing, or placement of small amounts on a substrate using a 0.25 inch wide stainless steel spatula. If dispensing of uncured adhesive was performed, a CAM/ALOT 1818 dispenser (Camalot Systems, Inc., Haverhill, Mass.) was used. If printing of uncured adhesive was performed, a Speedline MPM (Speedline Technologies, Inc., Franklin, Mass.) Model SPM Printer was used.

EXAMPLES

Example 1

This example demonstrates the preparation of one of the compositions according to the present invention.

The following components (a) and (b) were heated to the indicated temperature and then mixed one hour until uniform at 25° C. while the mixture slowly cooled to comprise Blend A at 60° C.:
  (a) 149.16 parts of an =SiH-containing polysiloxane polymer having a viscosity of $4.8 \times 10^{-3}$ Pa·s and,
  (b) 3.30 parts of 2-phenyl-3-butyn-2-ol.

The example adhesive composition consisted of the following components:
  (c) 592.54 parts of a resin consisting essentially of $\{(CH_3)_2 CH_2=CHSiO\}_{1/2}$ units, $\{(CH_3)_3SiO\}_{1/2}$ units, and $SiO_{4/2}$ units, wherein the mole ratio of total triorganosiloxane units to $SiO_{4/2}$ units is about 0.7:1
  (d) 113.14 parts of a dimethylvinylsiloxy-terminated polydimethylsiloxane having a viscosity of 55 Pa·s,
  (e) 1286.32 parts of a dimethylvinylsiloxy-terminated polydimethylsiloxane having a viscosity of 2 Pa·s,
  (f) 18.6 parts of carbon black powder having an average particle size of 45 nanometers,
  (g) 90 parts of an organosilicon based adhesion promoter having epoxy functionality,
  (h) 138.6 parts of Blend A from above,
  (i) 75 parts of polydimethylsiloxane fluid-treated fumed silica,
  (j) 3600 parts of spherical fused silica having an aspect ratio between 1.0 and 1.5 and an average particle size of 5 micrometers,
  (k) 9.60 parts of spherical divinylbenzene crosslinked styrene plastic beads having between 38 and 45 micron sieve,
  (l) 76.2 parts of a platinum complex of 1,3-diethenyl-1,1,3,3-tetramethyldisiloxane.

Components (c), (d), (e), (f), (g), (i), and (j) were added to a shear mixer and blended uniformly. The mixture was then heated to 150° C. while stirring continued. The mixture was held at this temperature for one hour, and the mixture was then cooled to less than 50° C. as mixing continue. Components (h), (k), and (l) were then added with the previous ingredients between 25° C. and 50° C. using adequate mixing to obtain a homogeneous blend of all components to provide the final adhesive.

Among other packaging substrates, the adhesive described can be used to assemble a silicon die (Tessera TV-46 test die) (Tessera Inc., San Jose, Calif.) to polyimide TAB tape substrates. Thereafter, during testing, cohesive failure of the die to the substrate is observed when the die is pulled off after curing the laminate for 1 hour at 150° C. Enough material was placed and held for 3 seconds with 750 grams force. Once the adhesive was cured, the die was peeled from the substrate by hand with a stainless steel spatula and the failure mode was observed. The above composition had the properties found on Table I below, along with the test results when used as a cured adhesive in a chip package.

TABLE I

| PROPERTY | VALUE |
| --- | --- |
| Viscosity @ 1 radian/sec. | 171,250 Poise |
| Cure Exotherm Peak Temperature | 120.5° C. |
| Linear CTE from 50° C. To 150° C. | 181 ppm/° C. |
| Tensile Strength at Break | 1059 psi |
| Elongation at Break | 24.2 percent |
| Modulus @ 25% Elongation | 32.9 psi |
| Specific Gravity | 1.53 |
| Durometer | 89.8 Shore A |
| Dielectric Constant 100 Hz | 2.99 |
| Dielectric Constant 100 kHz | 2.99 |

Example 2

This example demonstrates the preparation of a composition according to the present invention.

Blend A at 60° C. for (m) and (n):
  (m) 149.16 parts of trimethylsiloxy-terminated dimethylmethylhydrogen siloxane containing an average of five $HMeSiO_{2/2}$ units three $Me_2SiO_{2/2}$ units per molecule and having a viscosity of $4.8 \times 10^{-3}$ Pa·s and
  (n) 3.30 parts of 2-phenyl-3-butyn-2-ol.

The example adhesive consisted of the following components:
  (o) 589.41 parts of a resin consisting essentially of $\{(CH_3)_2 CH_2=CHSiO\}_{1/2}$ units, $\{(CH_3)_3SiO\}_{1/2}$ units, and $SiO_{4/2}$ units, wherein the mole ratio of total triorganosiloxane units to $SiO_{4/2}$ units is about 0.7:1,
  (p) 112.54 parts of a dimethylvinylsiloxy-terminated polydimethylsiloxane having an average degree of polymerization of 830 and a viscosity of 55 Pa·s,
  (q) 1279.54 parts of a dimethylvinylsiloxy-terminated polydimethylsiloxane having an average degree of polymerization of 434 and a viscosity of 2 Pa·s,
  (r) 18.50 parts of carbon black powder having an average particle size of 45 nanometers,
  (s) 89.53 parts of an organosilicon-based adhesion promoter having epoxy functionality,
  (t) 137.87 parts of Blend A from just above,
  (u) 74.60 parts of polydimethylsiloxane fluid treated fumed silica with a particle size averaging between 0.2 and 0.3 microns,
  (v) 3581.02 parts of spherical fused silica having an aspect ratio between 1.0 and 1.5 and an average particle size of 5 micrometers and a maximum particle size of 13 micrometers and a minimum particle size of 0.5 micrometers,
  (w) 41.18 parts of spherical divinylbenzene crosslinked styrene plastic beads having an aspect ratio between 1.0 and 1.5 and having a sieve size of 63 to 75 microns, and
  (x) 75.80 parts of a platinum complex of 1,3-diethenyl-1,1,3,3-tetramethyldisiloxane.

Components (o), (p), (q), (r), (s), (u), and (v), were added to a shear mixer and blended uniformly. The mixture was then heated to 150° C. while stirring continued. The mixture was held at this temperature for one hour, and the mixture was then cooled to less than 50° C. as mixing continued. Components (t), (w), and (x), were then added with the previous ingredients between 25° C. and 50° C. using adequate mixing to obtain a homogeneous blend of all components to provide the final adhesive.

Figure 3:
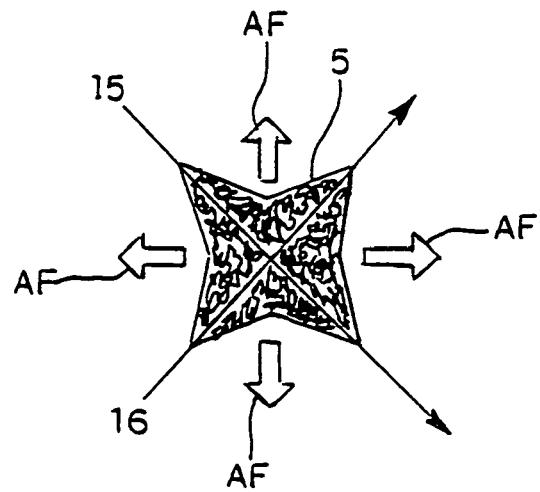
FIG. 3 is a schematic diagram of a possible dispersion of the die attach adhesive upon the application of pressure to the die as set forth in the processes of this invention.

FIG. 3 illustrates how an "X" pattern of printing was used to fill most of the area under a Tessera TV-46 silicon test die and on top of a 0.002 inch thick sheet of DuPont HN polyimide film from DuPont, of Wilmington, Del., to test the material of this example. The direction of major adhesive flow upon the application of pressure is shown by the designations "AF". In addition, there is shown the first dispense direction 15, and the second dispense direction 16 of the dispensing of the die attach adhesive 5. About 750 grams of force was applied to the die having dimensions of 0.2175 inches by 0.3030 inches, prior to curing for about one hour at 150° C. When the die and the polyimide film were peeled apart, cohesive failure of the adhesive was seen on each of the five test samples. Table II sets forth the measured properties of this adhesive in the uncured state and the cured state when used as a die attach adhesive.

TABLE II

| PROPERTY | VALUE |
| --- | --- |
| Viscosity @ 1 radian/sec | 113,800 Poise |
| Cure Exotherm Peak Temperature | 120.7° C. |
| Linear CTE from 50° C. To 150° C. | 174 ppm/° C. |
| Tensile Strength at Break | 1269 psi |
| Elongation at Break | 27.1 percent |
| Modulus @ 25% Elongation | 29.5 psi |
| Specific Gravity | 1.51 |
| Durometer | 88.8 Shore A |
| Dielectric Constant 100 Hz | 2.89 |
| Dielectric Constant 100 kHz | 2.9 |
| Dissipation Factor 100 Hz | 0.0004 |
| Dissipation Factor 100 kHz | <0.0002 |
| Volume Resistivity | $2.4 \times 10^{15}$ ohm-cm |
| Dielectric Strength | 532 V/mil |

This adhesive was designed to have a similar number of spacers as in Example 1, but with larger size spacers.

Example 3

The following example illustrates the significant processing steps that can be eliminated from the device packaging process of the prior art using the processes of this invention, yet allow excellent reliability of packaged parts.

Device packages have been built using printed silicone spacers. However, die attach adhesive must be printed on the spacers or dispensed between the spacers in order to attach the die. Pad adhesives require extra steps to remove liners used therein. The following "PROCESS STEPS TABLE" shows the process steps that can be eliminated if the compositions of this invention are used instead of the standard device packaging products from the prior art.

There are essentially five methods of performing die attach. All of the prior art processes using such methods must control the height of the die from the circuit substrate to insure that lead bond reliability remains high. The shape of the lead is directly related to the reliability, and the height from the substrate controls the shape of the lead. Except for the fifth method, the methods are set forth below illustrate the die attach adhesives of this invention.

Figure 4:
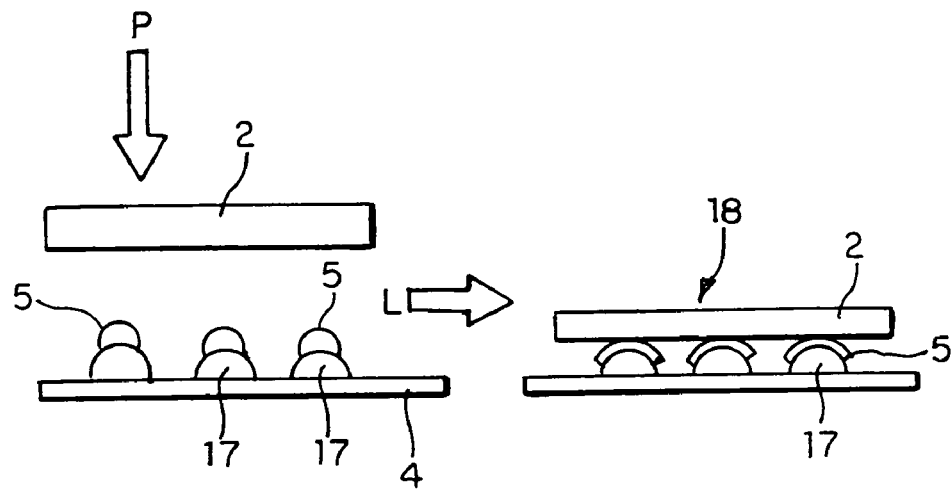
FIG. 4 is a schematic illustration of one of the methods of this invention that is the pre-cured polymeric spacer printed die method.

In the first method, the pre-cured polymeric spacer printed die attach method, and with reference to FIG. 4, spacers 17 are printed and then cured, and then die attach adhesive 5 is printed on top of the cured spacers 17. Pressure P is applied to the die 2 as it is surmounted on the die attach adhesive 5. Also shown in FIG. 4, for orientation purposes, is the polyimide substrate 4, the die 2, and there is also shown a lateral moving arrow L, moving to the right of the Figure to show the direction of movement of the assembly line to provide the final product 18.

Figure 5:
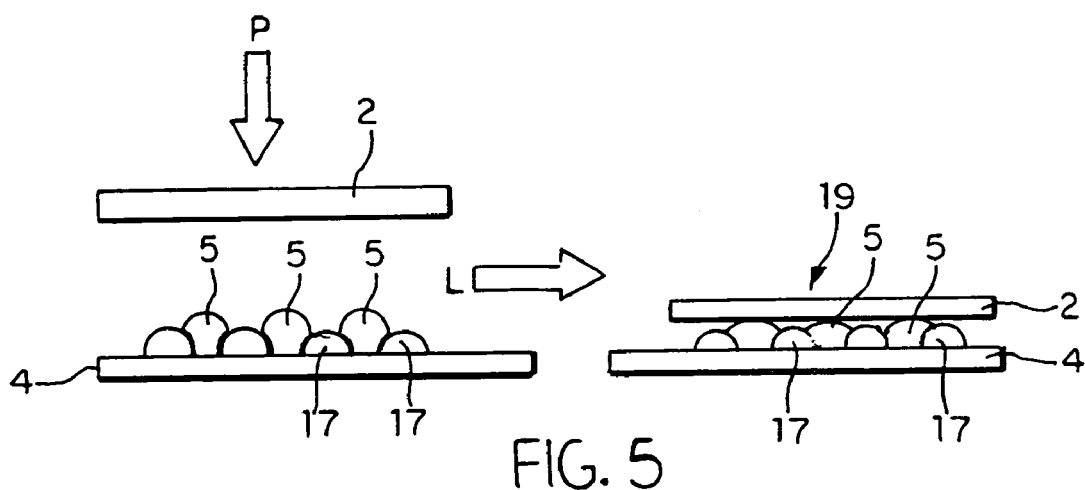
FIG. 5 is a schematic illustration of another method of this invention that is the pre-cured polymeric spacer dispersed die method.

The second method, the pre-cured polymeric spacer dispensed die attach method, is the use of spacers 17 that are printed and then the die attach adhesive 5 is dispensed on top and surrounding the cured spacers. See FIG. 5 wherein there is shown the die 2, the printed spacers 17, and the uncured dispensed die attach adhesive 5 surrounding the printed spacers 17.

Figure 6:
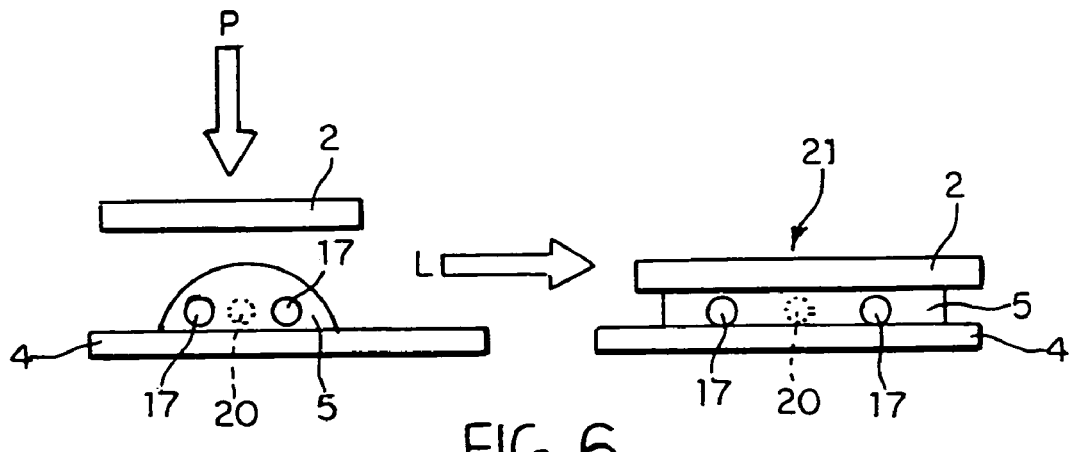
FIG. 6 is a schematic illustration of another method of this invention that is the printed or dispensed die attach pad method.

The third method, the printed or dispensed die attach pad method, and a very popular method, is the use of a pad adhesive. With reference to FIG. 6, there is shown the spacer beads 17, the pad of adhesive 5, a spacer 20 which is not in alignment with the spacers 17, the polyimide film 4, and the finished product 21.

Figure 7:
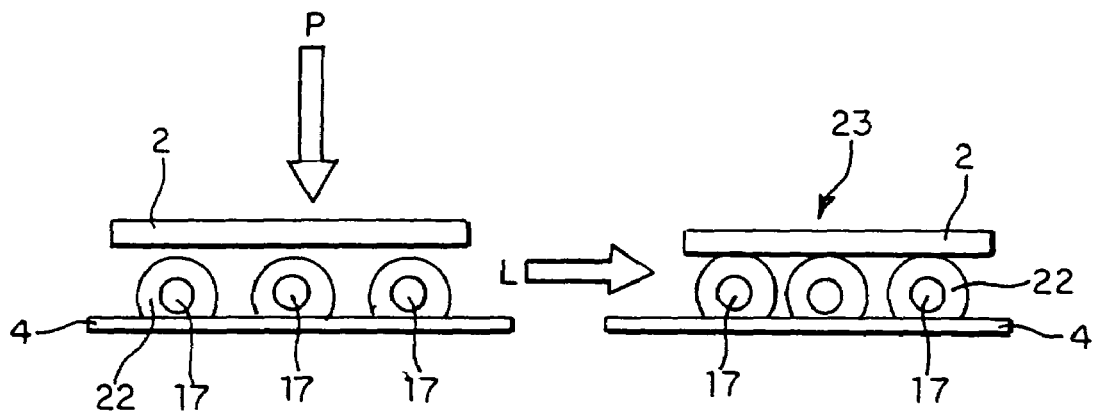
FIG. 7 is a schematic illustration of yet another method of this invention that is the printed or dispensed segmented pad method.

The fourth method, the printed or dispensed segmented pad method, can be found illustrated in FIG. 7, wherein uncured stencil printed die attach dots 22 are placed on the polyamide film 4. Thereafter, the die 2 is pressed onto the adhesive and is stopped a distance from the polyimide film by the spacers 17. The composite is then cured to give the product 23.

Figure 8:
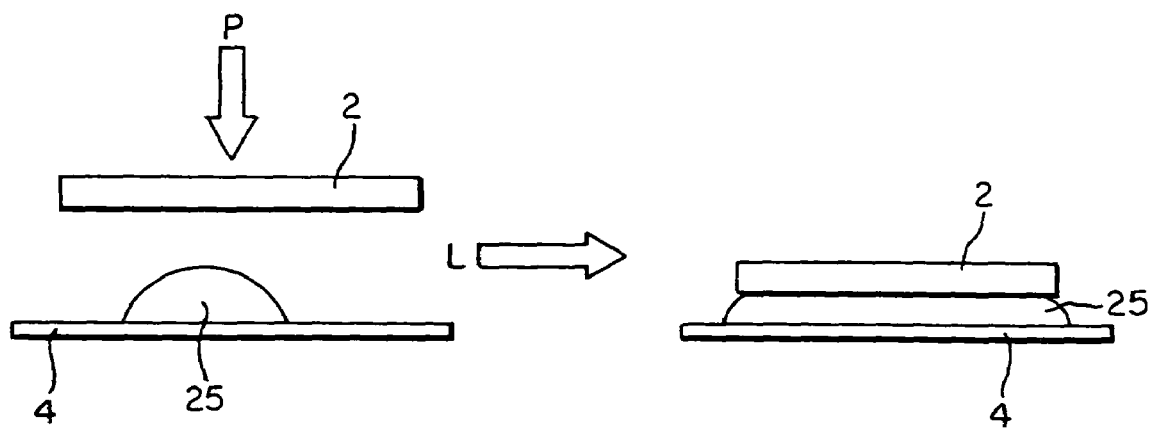
FIG. 8 is a schematic illustration of a method of the prior art that is a pressure, temperature, and time, related method that does not require spacer beads and is not considered part of this invention.

The fifth method, the temperature, pressure, and time, regulated method, is illustrated in FIG. 8. This method does not require the use of any spacer materials, and is dependent on the rheology of the based adhesive and the amount and/or combination of time, temperature and pressure that is used to form the space between the chip and the substrate. With reference to FIG. 8, there is shown the die 2, the substrate 4, and the adhesive 25 of the prior art. When these methods are used in the prior processes it can be observed from the following PROCESSING STEPS TABLE that there are more process steps, or there are major inadequacies of the method, and they tend to take more time to execute. The compositions of the instant invention do not require the extra steps, nor the length of time to execute the steps necessary to obtain a die attach, or do not suffer from the applied simultaneously complications of regulating time, temperature, pressure and the rheology of the base material. It can be applied as dots, by dispensing or printing the dots, or dispensed to form a pad and the heat and pressure can be PROCESS STEPS TABLE
(a comparison of the prior art methods to the methods
of the inventive process disclosed and claimed herein)
TYPE OF PROCESS

| Step No. | Print Spacers/ Print Die Attach | Print Spacers/ Dispense Die Attach | Use Pad Adhesive | A* As Dots | B** As Pad | C*** |
| --- | --- | --- | --- | --- | --- | --- |
| 1 | Print Spacers | Print Spacers | Remove liner | Print Spacers | Dispense Adhesive | Disp. Adh. |
| 2 | Cure Spacers | Cure Spacers | Punch or Place Adhesive | Attach hot die | Attach Hot die | Attach Hot die |
| 3 | Print die attach | Dispense die attach | Apply pressure and/or heat | | | |

-continued

PROCESS STEPS TABLE
(a comparison of the prior art methods to the methods
of the inventive process disclosed and claimed herein)
TYPE OF PROCESS

| Step No. | Print Spacers/ Print Die Attach | Print Spacers/ Dispense Die Attach | Use Pad Adhesive | A* As Dots | B** As Pad | C*** |
|---|---|---|---|---|---|---|
| 4 | Attach hot die | Attach hot die | Remove liner | | | |
| 5 | | | Attach hot die | | | |

*A is a composition of this invention wherein dots are used as the spacer material.
**B is a composition of this invention wherein pads are used as the spacer material.
***The steps of this method are essentially only two, but this method suffers from at least two problems. 1. There is great difficulty in preparing the base adhesives with the correct and useable rheology for use in this method, and 2., it is difficult to control the time, temperature and pressure of the method to obtain precise die attach products.
"Disp." means Dispense, and "Adh." means adhesive.

What I claim is:

1. A curable silicone adhesive composition comprising in combination:
   A. a curable polymeric base material comprising a curable silicone composition;
   B. contained in said polymeric base material:
      (i) inorganic insulating particles having mixed various sizes and having an average size of less than 10 μm, and,
      (ii) organic insulator particles having average particle sizes of 1 μm to 1000 μm and a major axis to minor axis ratio of about 1.0 to 1.5, said organic insulator particles being present in the composition in an amount of 0.16 to 0.69% by weight of the curable adhesive composition.

2. A curable adhesive composition as claimed in claim 1 wherein the organic insulator particles are divinylbenzene crosslinked polystyrene.

3. A semiconductor device in which at least two individual substrates are joined and bonded by an adhesive composition as claimed in claim 1.

4. The semiconductor device as claimed in claim 3 wherein the two individual substrates are a semiconductor die and an attachment substrate for the semiconductor die.

5. A process for joining at least two individual substrates, said process comprising:
   (I) applying an adhesive composition as claimed in claim 1 to at least one surface of at least one of the individual substrates;
   (II) mounting another individual substrate to the adhesive treated side of the substrate of (I) to form a laminate thereof;
   (III) applying pressure to the laminate to disperse the adhesive therebetween until each of the substrates contact the largest organic insulator particles of the adhesive composition, and thereafter,
   (IV) curing the adhesive composition.

6. The process as claimed in claim 5 wherein additionally, heat is applied in step (III).

7. The process as claimed in claim 5 wherein the two individual substrates are a semiconductor die and an attachment substrate for the semiconductor die.

8. An adhesive composition as claimed in claim 1, wherein the curable silicone composition has a cure mechanism selected from the group consisting of:
   (ii) condensation reactions;
   (iii) addition reactions;
   (iv) ultraviolet initiated radiation reactions, and,
   (v) free radical initiated reactions.

9. An adhesive composition as claimed in claim 1 wherein the silicone composition is an addition reaction curable silicone composition.

10. A curable adhesive composition as claimed in claim 1 wherein the organic insulator particles are divinylbenzene crosslinked polystyrene.

11. A semiconductor device in which at least two individual substrates are joined and bonded by an adhesive composition as claimed in claim 1.

12. The semiconductor device as claimed in claim 11 wherein the two individual substrates are a semiconductor die and an attachment substrate for the semiconductor die.

13. A process for joining at least two individual substrates, said process comprising:
   (I) applying an adhesive composition as claimed in claim 1 to at least one surface of at least one of the individual substrates;
   (II) mounting another individual substrate to the adhesive treated side of the substrate of (I) to form a laminate thereof;
   (III) applying pressure to the laminate to disperse the adhesive therebetween until each of the substrates contact the largest organic insulator particles of the adhesive composition, and thereafter,
   (IV) curing the adhesive composition.

14. The process as claimed in claim 13 wherein additionally, heat is applied in step (III).

15. The process as claimed in claim 13 wherein the two individual substrates are a semiconductor die and an attachment substrate for the semiconductor die.

16. An adhesive composition as claimed in claim 1, wherein the curable silicone composition has a cure mechanism selected from the group consisting of:
   (ii) condensation reactions;
   (iii) addition reactions;
   (iv) ultraviolet initiated radiation reactions, and,
   (v) free radical initiated reactions.

17. An adhesive composition as claimed in claim 1 wherein the silicone composition is an addition reaction curable silicone composition.

18. A curable adhesive composition comprising in combination:
   a curable silicone polymeric base material and contained in said silicone polymeric base material, organic insulator particles having average particle size of 1 μm to 1000 μm and a major axis to minor axis ratio of about 1.0 to 1.5, said organic insulator particles being present in the composition in an amount sufficient to provide a planar adhesive bond thickness between substrates being joined by said adhesive.

* * * * *